United States Patent
Farnworth

[19]

[11] Patent Number: 6,008,070
[45] Date of Patent: Dec. 28, 1999

[54] WAFER LEVEL FABRICATION AND ASSEMBLY OF CHIP SCALE PACKAGES

[75] Inventor: Warren M. Farnworth, Nampa, Id.

[73] Assignee: Micron Technology, Inc., Boise, Id.

[21] Appl. No.: 09/082,745

[22] Filed: May 21, 1998

[51] Int. Cl.$^6$ .................................................. H01L 21/44
[52] U.S. Cl. ........................ 438/114; 438/110; 257/727; 257/794
[58] Field of Search ................................... 438/110, 113, 438/114; 257/727, 794, 758, 632

[56] References Cited

U.S. PATENT DOCUMENTS

| | | |
|---|---|---|
| 3,456,334 | 7/1969 | Baker et al. . |
| 3,735,483 | 5/1973 | Sheldon . |
| 4,749,631 | 6/1988 | Haluska et al. . |
| 4,756,977 | 7/1988 | Haluska et al. . |
| 4,769,345 | 9/1988 | Butt et al. . |
| 4,821,151 | 4/1989 | Pryor et al. . |
| 4,866,571 | 9/1989 | Butt . |
| 4,967,260 | 10/1990 | Butt . |
| 5,014,159 | 5/1991 | Butt . |
| 5,128,737 | 7/1992 | Van Der Hare . |
| 5,323,051 | 6/1994 | Adams et al. . |
| 5,336,928 | 8/1994 | Neugebauer et al. . |
| 5,455,455 | 10/1995 | Babehi . |
| 5,455,459 | 10/1995 | Fillion et al. . |
| 5,481,135 | 1/1996 | Chandra et al. . |
| 5,497,033 | 3/1996 | Fillion et al. . |
| 5,547,906 | 8/1996 | Badehi . |
| 5,682,065 | 10/1997 | Farnworth et al. . |

*Primary Examiner*—Charles Bowers
*Assistant Examiner*—Martin Sulsky
*Attorney, Agent, or Firm*—Trask, Britt & Rossa

[57] ABSTRACT

A method for producing integrated circuit devices comprises the steps of forming and packaging such devices at the wafer scale, including forming a plurality of chip circuits with bond pads, adhesively fixing a plate of glass to the active surface of the wafer, slicing the wafer, applying a sealant layer to the backside of the wafer, forming contact holes through the upper glass plate, metallizing the glass plate and singulating the individual chips. Use of etchable glass for the package and palladium for metallization provides an advantageous construction method.

60 Claims, 5 Drawing Sheets

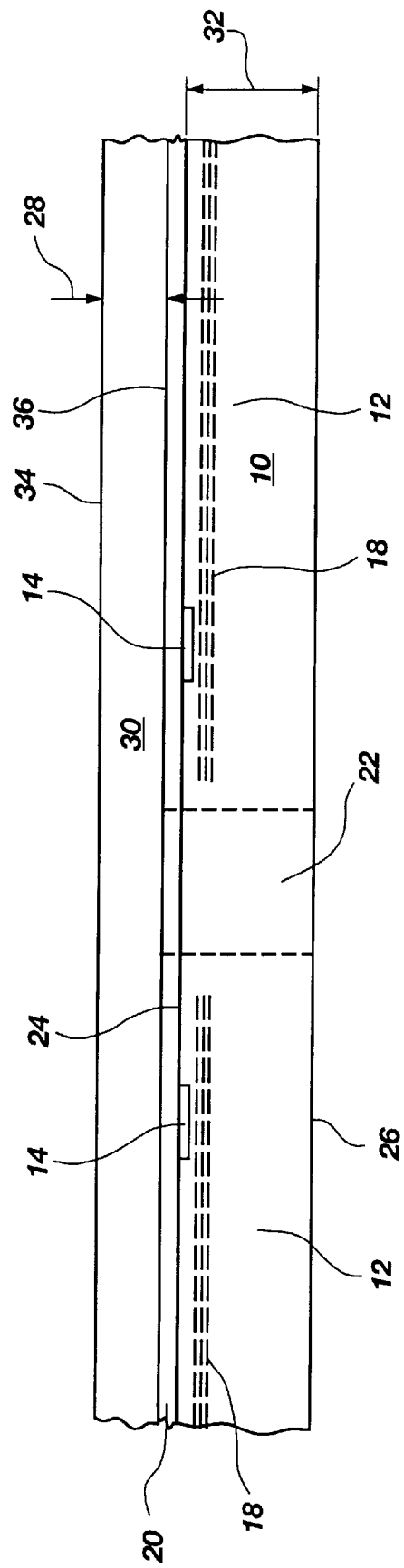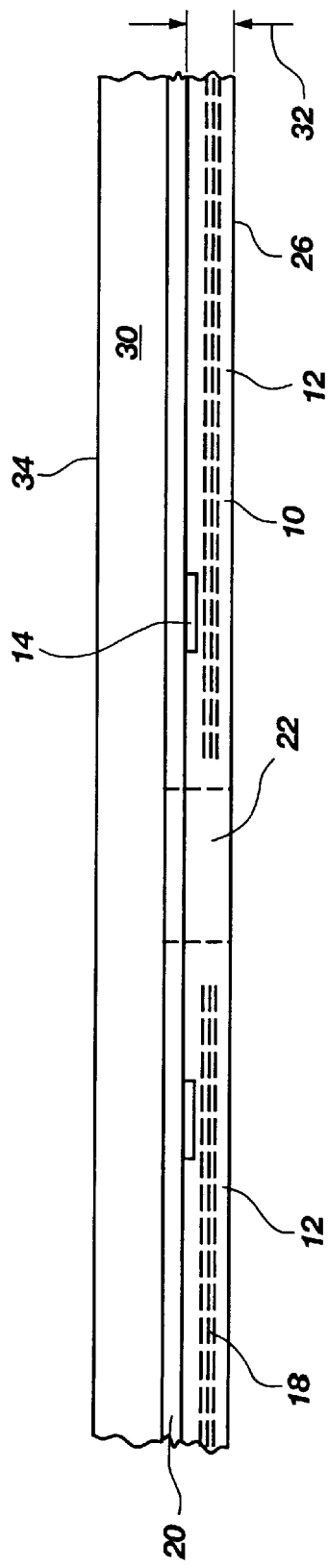

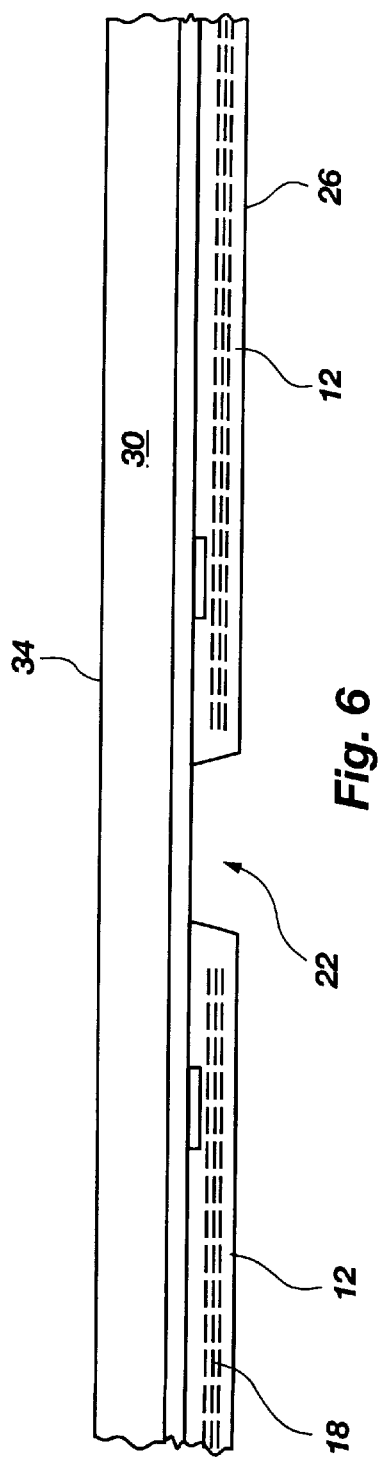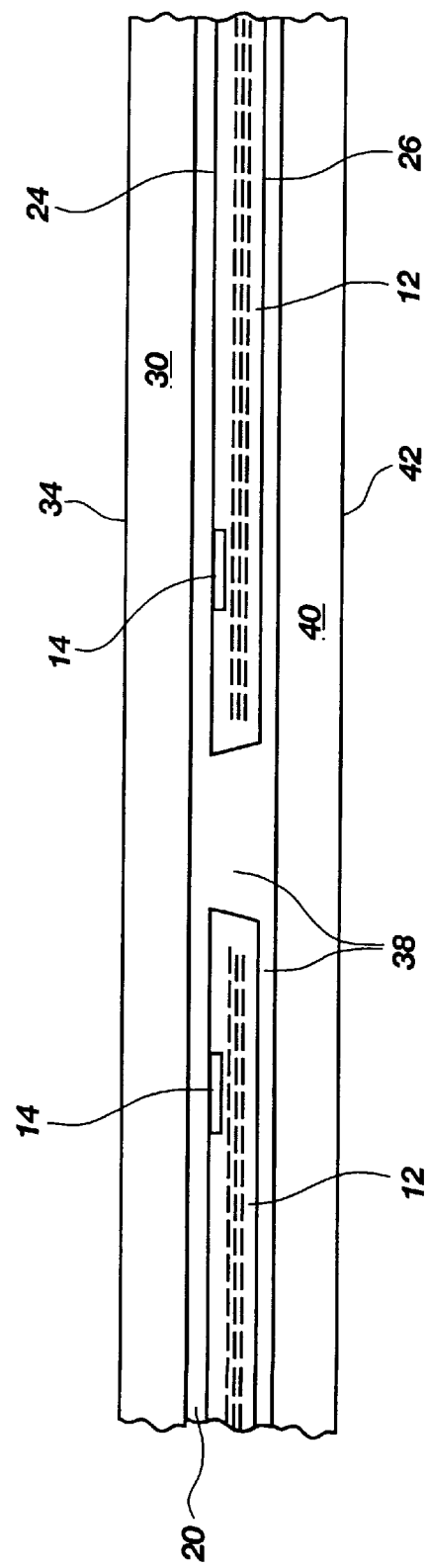

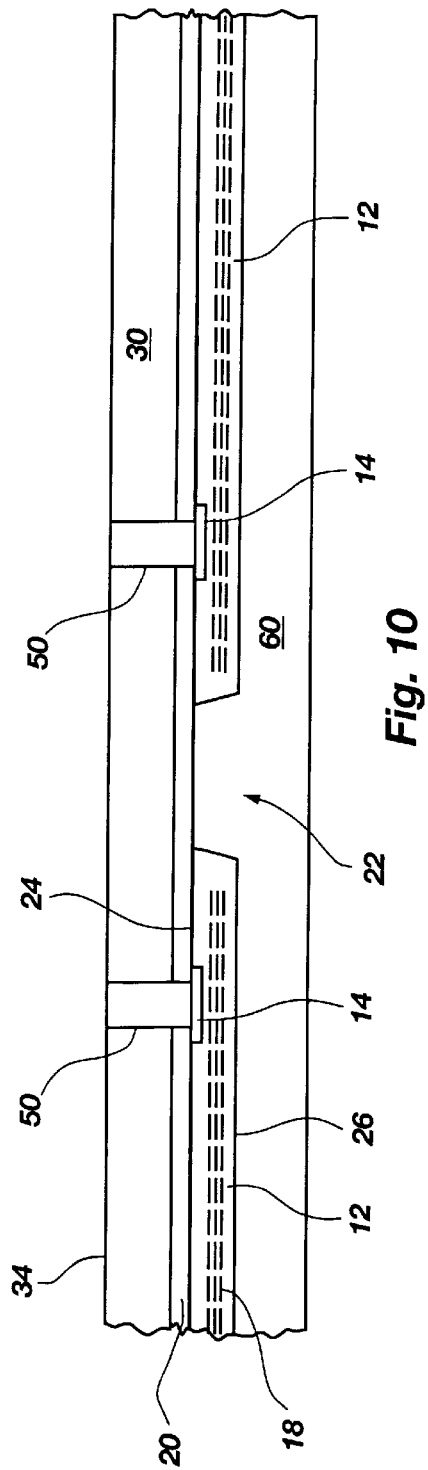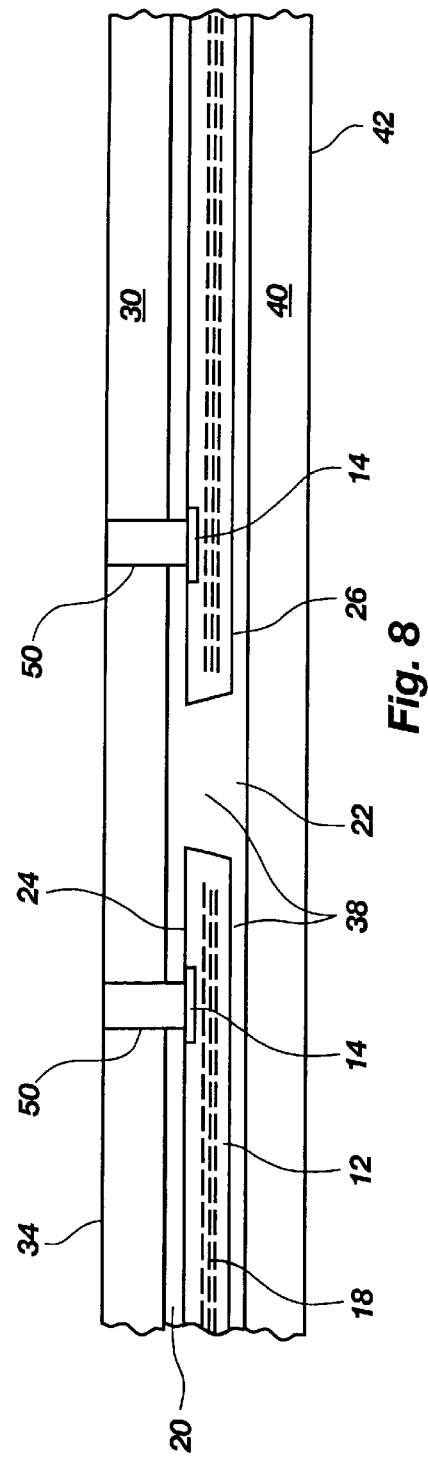

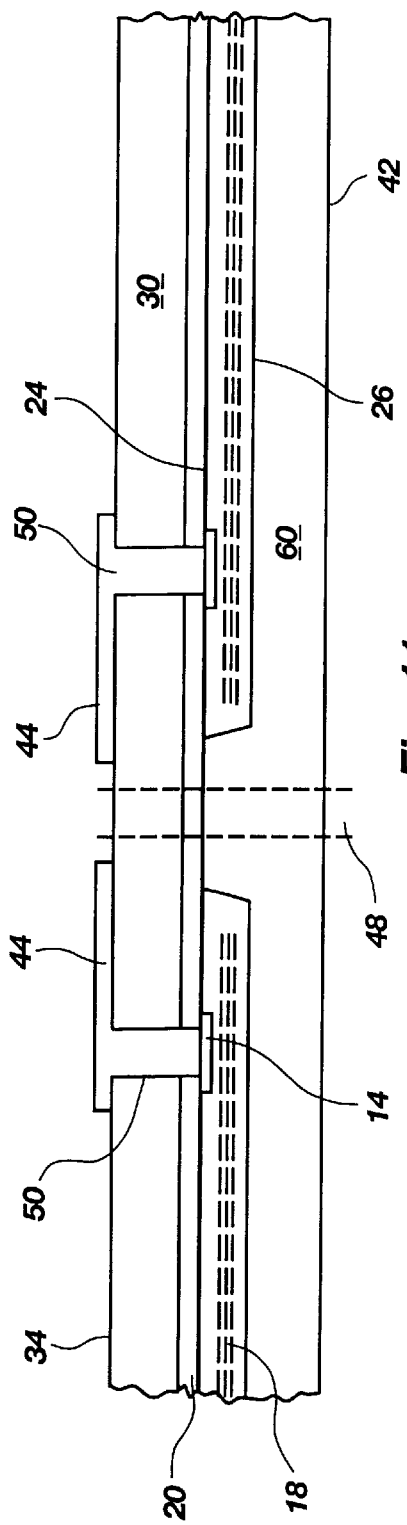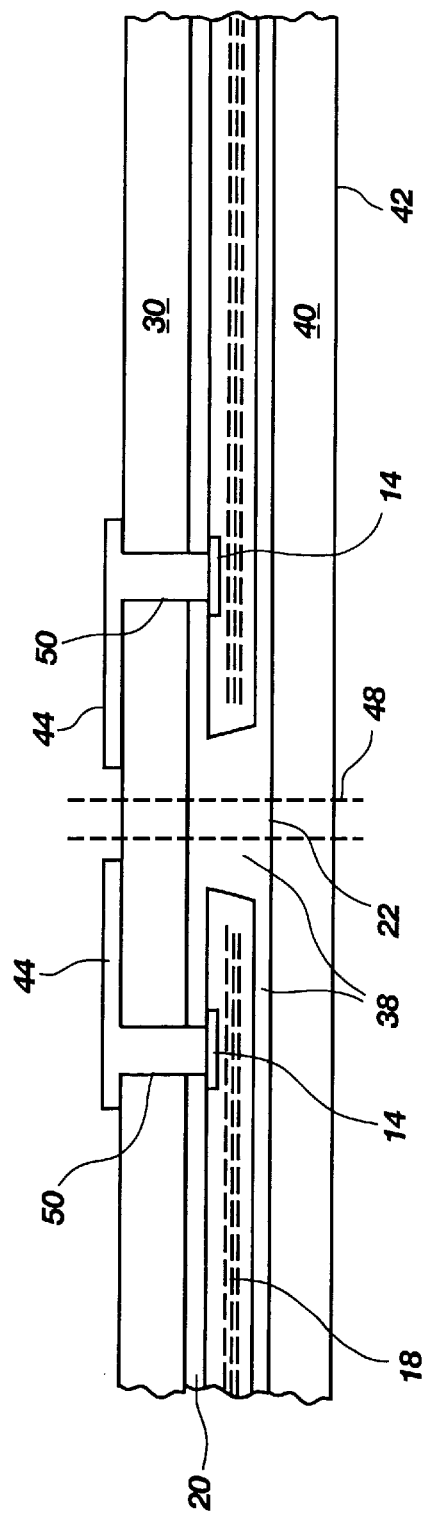

WAFER LEVEL FABRICATION AND ASSEMBLY OF CHIP SCALE PACKAGES

BACKGROUND OF THE INVENTION

1. Field of the Invention

This invention relates to packaged semiconductor devices and methods for manufacture thereof. More particularly, the invention pertains to ultra-thin devices having a small footprint and simplified processes for their manufacture including device packaging at the wafer scale.

2. Description of the Related Art

Solid state electronic devices, more colloquially known as semiconductor chips or dice, are typically manufactured from a semiconductor material such as silicon, germanium or gallium/arsenide. Circuitry is formed on one surface of the device with input and output (I/O) pads formed around the periphery or centrally positioned to facilitate electrical connection with a host electrical apparatus.

A profusion of small electronic consumer products includes pagers, notebook computers, cellular telephones, digital cameras, modems, global position systems and electronic watches, to name a few. The rapidly growing consumer demand for small product size and low profile products drives the search for ways to construct smaller, thinner, more powerful semiconductor devices. The development of inexpensive, ultra-thin, compact devices is needed to enable the proliferation of large numbers of miniature electronic apparatus in the near future.

Currently, semiconductor chips are typically packaged to protect the chip from mechanical damage, external contamination and moisture. Most commonly, semiconductor chips are encapsulated, i.e. packaged within a polymeric material which sometimes provides opportunity for moisture ingress, gas diffusion, corrosion, etc. Thus, plastic encapsulated chips may be subject to performance degradation and abbreviated life.

Ceramic encapsulation provides a higher level of protection for the chip. However, the process is more complex and results in an expensive package of increased size.

Sealing of the semiconductor chip active circuitry at the wafer stage is known. In this process, a passivation coating of ceramic materials such as silica and/or silicon nitride may be applied by chemical vapor deposition (CVD). However, the subsequent etching back of the passivation coating at the bond pads of the semiconductor chip may damage the coating around the bond pads, resulting in a non-hermetic seal and permitting corrosion to deleteriously affect chip reliability and life.

U.S. Pat. No. 5,336,928 of Neugebauer et al. discloses a hermetically sealed device constriction.

U.S. Pat. Nos. 5,455,459 and 5,497,033 of Fillion et al. disclose systems for enclosing and interconnecting multiple semiconductor chips.

U.S. Pat. No. 5,481,135 of Chandra et al. discloses the use of ceramic materials in heretically sealed device packages.

U.S. Pat. No. 4,769,345 of Butt et al., U.S. Pat. Nos. 4,866,571, 4,967,260 and 5,014,159 of Butt, U.S. Pat. No. 5,323,051 of Adams et al., and U.S. Pat. No. 4,821,151 of Pryor et al. disclose the use of glass in the packaging of certain types of semiconductor devices.

U.S. Pat. Nos. 4,749,631 and 4,756,977 of Haluska et al. disclose ceramic and ceramic-like compositions which may be used for coating electronic devices.

In U.S. Pat. No. 5,682,065 of Farnworth et al., a fully hermetically sealed semiconductor chip is disclosed. The bare die is covered with a coating of glass using a spin-on-glass (SOG) process, a dip process or flow coating. The glass is applied as a mixture of small glass particles and a polymeric carrier, and subsequently heated to evaporate solvent(s) from the mixture and harden the applied material. Also disclosed are steps of thinning the wafer.

U.S. Pat. No. 5,547,906 of Badehi discloses a method for forming semiconductor chip packages with edge connections. The step of singulation with a cutting tool exposes the array of contacts. A glass may be used as covers sandwiching the chip therebetween.

BRIEF SUMMARY OF THE INVENTION

The invention comprises a method for fabricating size-efficient semiconductor devices, including hermetically sealed devices, wherein most of the operations are conducted at the wafer scale. The method enables the simplified manufacture of ultra-thin packaged devices, having a footprint only slightly larger than the die size.

A wafer is prepared with multiple die sectors having internal circuits with conductive bond pads. A thin plate of glass is then adhesively attached to the active side of the wafer. The glass is configured for photo-etching, making repatterning of the wafer front side prior to glass overlay unnecessary. Furthermore, scribing of the wafer prior to metallization of the glass plate is unnecessary.

If needed, the exterior surface of the glass plate is leveled and made parallel to the front side (active surface) of the wafer and polished, based on the wafer's parallel backside. The levelling, paralleling and cleaning of the glass plate prepares the exterior glass surface for metallization.

The backside of the wafer is then reduced in thickness by chemical, mechanical, or chemical-mechanical means, such as are known in the art, to provide chip substrates with minimum thickness. The wafer is then cut or etched in the street areas between the chip sectors to individualize the chips, while leaving intact the tipper glass plate to which the chips are individually attached. The glass plate enhances the resistance to premature breakage along the street areas or of the chips themselves.

A second glass plate is then adhesively affixed to the backside of the wafer, the adhesive filling the opened street areas between the chip sectors.

Alternatively, a polymeric sealant material may be applied over the backside of the wafer, instead of adhesively attaching the second plate of glass. In addition, another alternative is applying a mixture of glass particles and polymer, which may be applied in a spin-on-glass process.

On the upper glass plate, contact holes are formed through the glass and adhesive to access the bond pads, using a photolithographic etching process. The glass plate is then metallized and etched to define leads thereon.

Preferably, metallization of the front side of the glass plate is based on palladium or a palladium alloy, which, because of its solder wettability, eliminates the need for a solder mask limiting layer. A chemical vapor deposition (CVD) process or sputtering process deposits the conductive metal in the contact holes and on the glass surface, and a subsequent patterning of the metallization enables the formation of interconnects on the glass surface. Alternately, deposit may be made by wet deposition by first sputtering metal, such as aluminum, etc., then patterning the metal (aluminium), then using a zincate process, applying nickel, then applying a flash plating of palladium, which results in a thicker metal and a lower resistance with less palladium being required.

The chips may then be singulated by e.g., sawing, and the die of each chip will be entirely enclosed.

To ensure that the chip is fully hermetically sealed, a coating of silicon nitride may be applied prior to, or following, the step of metallizing the upper glass surface.

In an alternative embodiment of the invention, glass is applied to the front side and/or backside of the wafer as spin-on-glass (SOG), which may be polished flat.

BRIEF DESCRIPTION OF THE DRAWINGS

The invention is illustrated in the following figures, wherein the elements are not necessarily shown to scale but are uniformly identified throughout:

FIG. 4 is a partial cross-sectional view of a wafer of semiconductor chips illustrating initial steps of the method of the invention;

FIG. 5 is a partial cross-sectional view of a wafer of semiconductor chips illustrating further steps of the method of the invention;

FIG. 6 is a partial cross-sectional view of a wafer of semiconductor chips illustrating additional steps of the method of the invention;

FIG. 7 is a partial cross-sectional view of a wafer of semiconductor chips illustrating still further steps of the method of the invention;

FIG. 8 is a partial cross-sectional view of a wafer of semiconductor chips illustrating added steps of the method of the invention;

FIG. 9 is a partial cross-sectional view of a wafer of semiconductor chips illustrating additional steps of the method of the invention;

FIG. 10 is a partial cross-sectional view of an alternative wafer of semiconductor chips illustrating alternative steps of the method of the invention; and FIG. 11 is a partial cross-sectional view of an alternative wafer of semiconductor chips illustrating additional alternative steps of the method of the invention.

DESCRIPTION OF THE ILLUSTRATED EMBODIMENTS

Figure 1:
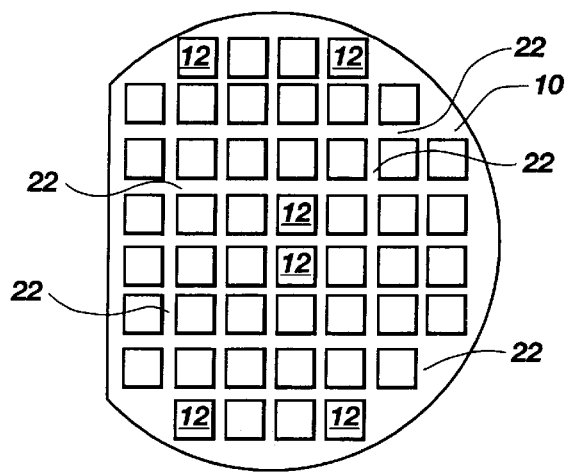
FIG. 1 is a plan view of a semiconductor wafer having a plurality of semiconductor chips formed thereon.

Referring to drawing FIG. 1, a wafer 10 is shown comprising a plurality of semiconductor chips or dice 12 formed thereon. Each semiconductor chip 12 may include a suitable passivation layer or layers (not shown) which is well known in the art for providing a degree of protection for the active circuitry on the chip 12. As shown, the semiconductor chips or dice 12 have not been separated but remain in the form of a wafer 10 for additional wafer processing. While in wafer form, each individual semiconductor chip 12 is distinguished from adjacent chips by generally circuit-free street areas 22 therebetween.

In the following description, the term "silicon" will be used in a generic sense to include other semiconductive materials such as gallium/arsenide or germanium, which are useful for fabricating electronic devices.

Figure 2:
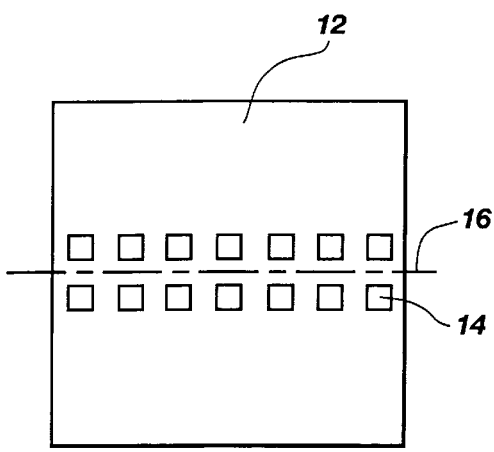
FIG. 2 is a plan view of a bare semiconductor chip having a bond pad arrangement applicable to the method of the invention.

As depicted in drawing FIG. 2, a semiconductor chip 12 has a leads-over-chip configuration. Bond pads 14 are connected to circuitry within the chip 12 for access by a host electronic apparatus, not shown. The bond pads 14 are typically arrayed in one or two rows near a central axis 16 of the chip 12, as shown by representation in drawing FIG. 2, and may comprise a large number.

Figure 3:
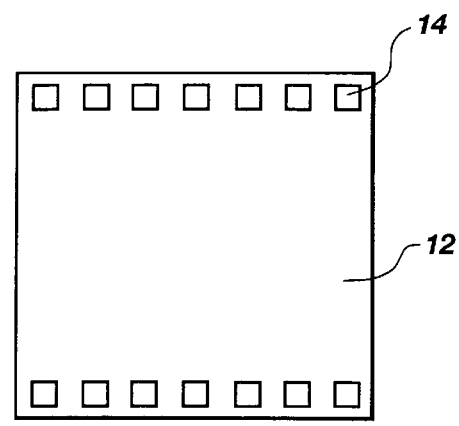
FIG. 3 is a plan view of another type of semiconductor chip having a bond pad arrangement applicable to the method of the invention.

In drawing FIG. 3, another semiconductor chip 12 is shown with bond pads 14 positioned near opposed edges of the chip.

Chips may be formed with other bond pad configurations. The invention as described herein is applicable irrespective of the bond pad position on the chip 12.

Referring now to drawing FIGS. 4 through 11, the method of the present invention will be described with reference to a portion of a wafer 10 showing portions of several semiconductor chips 12 located thereon.

In drawing FIG. 4 is shown a portion of a silicon substrate wafer 10 which may be prepared in accordance with procedures common in the art. The substrate wafer 10 has a first side 24 and an opposed second side 26, and a thickness 32. The wafer 10 is shown with portions of two semiconductor chips 12 formed therein. Each chip 12 has an internal circuitry 18 which is connected to bond pads 14 on the first side 24, also known as an "active surface". Passivation coatings, not shown, may be applied to portions of the first side 24, as known in the art. Street areas 22 separate the individual chips 12 on the wafer 10.

Before separating the chips 12 from the unitary wafer 10, a first thin plate 30 of glass is affixed to the first side 24 of the wafer 10 by an adhesive material 20 to preferably overcover the entire wafer. The adhesive 20 may be, for example, an epoxy, polyimide, etc. Examples of such are two-part epoxies, low temperature curing polyimide-siloxanes, two-part adhesives, etc. The glass plate 30 is preferably a photo-etchable glass having an exposed or outer surface 34 and an inner surface 36, with a thickness 28 of about 200 to about 2000 $\mu$m. An example of such a glass plate 30 is photosensitive glass sold by SchottGlass of Yonkers, New York, under the trademark FOTURAN™. The photo-etchable glass plate 30 is commercially available in thicknesses of 200 to 2000 $\mu$m.

If necessary, the exposed or outer surface 34 of the glass plate 30 is planarized and polished, based on the second side 26, i.e., backside of the wafer 10. Use of the backside 26 as a level surface standard may be particularly required if less expensive glass plate of less stringent tolerances is used. In any event, the outer surface 34 of the glass plate 30 must meet surface requirements for subsequent application of metallization thereto.

Turning now to drawing FIG. 5, the wafer 10 is shown with a reduced thickness 32. The second side 26 of the wafer 10 is subjected to a thinning step which may comprise a chemical etching process, a mechanical abrasion process, or a process by which the wafer surface is wet-polished with a chemical etchant/abrasive slurry. The second side 26 is also planarized, based on the exposed outer surface 34 of the first glass plate 30. Alternatively, if no further thinning of the wafer 10 is desired, the step is omitted. Etching through of the wafer 10 in street areas 22 is more readily accomplished when the wafer is relatively thin.

As depicted in drawing FIG. 6, the chips 12 are separated by dividing the wafer along the street areas 22. The street areas 22 of the wafer are, for example, etched out to separate the chips 12, while each chip remains attached to the unitary first glass plate 30. Etching processes and systems which may be used to etch the semiconductor material are well known in the art, and include the application and development of resist material; not shown, for limiting the etched area. Alternatively, the street area 22 may be mechanically scribed to provide individual chips 12 on glass plate 30. The assembly of the wafer 10 and the glass plate 30 is then coated with a hermetic coating, such as silicon nitride, on the backside thereof.

As shown in drawing FIG. 7, a second glass plate 40 is then fixed to the second (backside) surface 26 of the chips 12 by a sealant adhesive 38. The adhesive 38 fills the street area 22 removed to separate the chips 12, and is configured to be sealingly bonded to the first adhesive 20. Thus, each chip 12 is completely surrounded by a sealing adhesive. The second glass plate 40 is shown with an exterior surface 42 which generally forms one surface of the completed semiconductor device.

Turning to drawing FIG. 8, the next step of the process is illustrated as comprising the formation of linear contact holes 50 through the first (upper) glass plate 30 and adhesive 20. These holes 50 are formed by etching or by a mechanical, e.g., drilling, process. The holes 50 are aligned in an array which is identical to the array of bond pads 14 on the first surface 24 of the wafer 10. The holes typically have an internal diameter of about 20 to 100 $\mu$m. An aspect ratio of about 30 to 1 is desirable for consistent filling of the contact holes with metal.

As shown in drawing FIG. 9, external leads 44 are formed by metallizing the outer surface 34 of the first glass plate 30, using a photo-lithographic process. While metals such as tungsten, aluminum and copper, or alloys thereof, may be deposited as leads, a preferred conductive material is palladium or an alloy thereof, because of its wettability for subsequent soldering.

The metallization includes an interconnect for each lead 44 by which connection may be made to an electrical apparatus such as a circuit board. If desired, a lead frame, not shown, may be attached to the packaged chip and wire bonded thereto. Surface mount interconnects including ball grid arrays (BGA) may be formed on the first glass for attachment to a circuit board or other substrate.

Singulation of the chips 12 results from cutting through the glass plates 30 and 40 and the adhesives 20 and 38 along paths 48 through the street areas 22.

In drawing FIGS. 10 and 11, depicted is an alternative configuration of the semiconductor package, in which the sealant layer 60 applied to the second side (backside) of the wafer 10 may be (a) a glass-polymer mixture applied by spin-on-glass techniques or (b) a layer of sealant polymer. The glass-polymer is hardened by a heat treatment step which drives off solvent.

In summary, the steps of the process for making semiconductor chips are:

1. Individual integrated circuits 18 are formed in a plurality of semiconductor chips 12 on a wafer 10, each chip having electrically conductive bond pads 14 on the first side 24 of wafer 10.

2. The chip circuits 18 are optionally tested in wafer form.

3. A first glass plate 30 is fixed to the active side 24 of a wafer 10 with adhesive 20 (or, alternatively, glass can be applied as SOG).

4. Optionally, the glass plate 30 is polished and flattened to planarize it parallel to the backside 26 of the wafer 10.

5. The wafer 10 is thinned by grinding/etching (preferably by Chemical-Mechanical Polishing (CMP)) to planarize the backside 26.

6. Use chemical, mechanical, or CMP process to cut through the street areas 22 of the wafer 10 and separate individual chips 12 while maintaining their attachment to the unitary glass plate 30.

7. An insulative material is applied to the backside 26 of the wafer 10. The layer may comprise a second glass plate 40 adhesively applied to the wafer, a layer 60 of spin-on-glass (SOG), or a polymeric material.

8. An array of linear contact holes 50 is formed through the first glass plate 30 to contact the bond pads 14.

9. The first glass plate 30 is metallized to fill the contact holes 50 and form interconnects on the glass outer surface 34. The metal leads 44 may comprise any of a large number of metals or alloys in use. Preferably, however, the metallization comprises palladium or a palladium alloy, whose use obviates a solder mask to limit solder reflow.

10. Optionally, a coat of silicon nitride may be applied to the device to enhance hermeticity of the package. This application may be prior to or following metallization.

11. The chips 12 are singulated by cutting through the street areas 22 surrounding each chip.

The semiconductor chips 12 may be subjected to testing at the wafer stage either prior to encapsulating with glass or following completion of the metallization step, preferably before chip singulation.

There are a number of advantages which accrue from the use of the present invention.

First, the package may be made truly hermetically sealed.

Second, use of the backside of the silicon wafer permits paralleling the first glass plate to the wafer front, thus eliminating a process step and allowing the use of an unground, inexpensive glass plate material.

Third, the surface of the first glass plate may be prepared for metallization during its planarization, eliminating a separate step.

Fourth, the use of photo-etchable glass obviates a repattern step prior to overlay of the first glass plate, resulting in lower trace resistance and parasitic losses as well as shorter traces for increased speed.

Fifth, the use of photo-etchable glass eliminates the need to scribe the wafer prior to the metallization step.

Sixth, the use of palladium metallization eliminates the need to add a solder mask limiting layer after the under bump metallization (UBM) is applied.

It is apparent to those skilled in the art that various changes and modifications may be made to the chip configurations of the invention and methods of making and practicing the invention as disclosed herein without departing from the spirit and scope of the invention as defined in the following claims.

What is claimed is:

1. A method of making semiconductor devices, said method comprising:

providing a semiconductor wafer substrate having a first side and a second side, a plurality of semiconductor devices formed on said wafer substrate with street areas therebetween, each of said plurality of semiconductor devices having at least one circuit formed therein and at least one bond pad on a first side thereof, said at least one bond pad connected to said at least one circuit;

adhesively fixing a first plate of glass to said first side of said wafer substrate, said first plate of glass having an exterior surface and a substantially parallel interior surface;

reducing a thickness of said wafer substrate by removing a portion of the second side thereof;

separating said semiconductor devices by removing substrate material in said street areas, said semiconductor devices remaining fixed to said first glass plate;

applying a sealant material to said second side of said wafer substrate;

forming an array of contact holes extending through said first glass plate to the at least one bond pad;

metallizing said exterior surface of said first glass plate to form a pattern of conductive leads for connecting said at least one bond pad to said metallized exterior surface of said first glass plate; and singulating said semiconductor devices by separation thereof in said street areas.

2. The method of claim 1, further comprising:

applying a sealant material to said second side;

forming an array of contact holes extending through said first glass plate to the array of said bond pads;

metallizing said exterior surface of said first glass plate to form a pattern of conductive leads for connecting said bond pads to said metallization on the first surface of said first glass plate; and singulating said semiconductor devices by separation thereof in said street areas.

3. The method in accordance with claim 1, further comprising the step of flattening, planarizing and polishing the exterior surface of said first glass plate in correlation with the second side of said wafer substrate after fixing said first glass plate to said first side of said wafer substrate with adhesive.

4. The method in accordance with claim 1, wherein said first plate of glass is photo-etchable.

5. The method in accordance with claim 1, wherein said reducing step includes planarizing the second side of said wafer substrate to be parallel with the exterior surface of said first glass plate.

6. The method in accordance with claim 1, wherein the thickness of said wafer substrate is reduced by a chemical etching step.

7. The method in accordance with claim 1, wherein the thickness of said wafer substrate is reduced by a mechanical polishing step.

8. The method in accordance with claim 1, wherein the thickness of said water substrate is reduced by mechanical polishing with a chemical etchant/abrasive slurry.

9. The method in accordance with claim 1, wherein said step of separating said semiconductor devices comprises etching through the wafer substrate in the street areas.

10. The method in accordance with claim 1, wherein said step of separating said semiconductor devices comprises mechanical scribing.

11. The method in accordance with claim 1, wherein said step of applying said sealant material to said second side of said wafer substrate comprises attaching a second plate of glass to said second side of said wafer substrate with a sealant adhesive.

12. The method in accordance with claim 1, wherein the step of applying said sealant material to said second side of said wafer substrate comprises application of a polymeric sealant thereto.

13. The method in accordance with claim 1, wherein the step of forming said contact holes comprises forming substantially linear holes through said first glass plate in an array substantially identical to the at least one bond pad.

14. The method in accordance with claim 13, wherein said substantially linear holes are formed by one of a photo-etching process and a mechanical drilling process.

15. The method in accordance with claim 1, wherein said metallizing step comprises applying a metal to said exterior surface of said first glass plate including said contact holes, and etching to provide separate interconnects and leads passing through said contact holes to connect said interconnects with said at least one bond pad.

16. The method in accordance with claim 1, wherein said metallization is applied by chemical vapor deposition (CVD).

17. The method in accordance with claim 1, wherein said metallization is applied by sputtering.

18. The method in accordance with claim 1, wherein said metallizing step comprises application of one of tungsten, aluminum and copper, and alloys thereof.

19. The method in accordance with claim 1, wherein said metallizing step comprises application of one of palladium and an alloy thereof.

20. The method in accordance with claim 1, further comprising the step of applying an insulative sealant coating over said exterior surface of said first glass layer prior to the metallizing step.

21. The method in accordance with claim 20, wherein said insulative sealant coating comprises silicon nitride.

22. A method of making semiconductor devices, said method comprising:

providing a semiconductor wafer substrate having a first side and a second side, a plurality of semiconductor devices formed on said wafer substrate with street areas therebetween, each of said plurality of semiconductor devices having at least one circuit formed therein and at least one bond pad on a first side thereof, said at least one bond pad connected to said at least one circuit;

adhesively fixing a first plate of glass to said first side of said wafer substrate, said first plate of glass having an exterior surface and a substantially parallel interior surface;

reducing a thickness of said wafer substrate by removing a portion of the second side thereof;

separating said semiconductor devices by removing substrate material in said street areas, said semiconductor devices remaining fixed to said first glass plate; and applying a sealant material to said second side of said wafer substrate.

23. The method of claim 22, further comprising:

forming an array of contact holes extending through said first glass plate to the at least one bond pad;

metallizing said exterior surface of said first glass plate to form a pattern of conductive leads for connecting said at least one bond pad to said metallized exterior surface of said first glass plate; and singulating said semiconductor devices by separation thereof in said street areas.

24. The method in accordance with claim 23, further comprising the step of flattening, planarizing and polishing the exterior surface of said first glass plate in correlation with the second side of said wafer substrate after fixing said first glass plate to said first side of said wafer substrate with adhesive.

25. The method in accordance with claim 23, wherein said first plate of glass is photo-etchable.

26. The method in accordance with claim 23, wherein said reducing step includes planarizing the second side of said wafer substrate to be parallel with the exterior surface of said first glass plate.

27. The method in accordance with claim 23, wherein the thickness of said wafer substrate is reduced by a chemical etching step.

28. The method in accordance with claim 23, wherein the thickness of said wafer substrate is reduced by a mechanical polishing step.

29. The method in accordance with claim 23, wherein the thickness of said wafer substrate is reduced by mechanical polishing with a chemical etchant/abrasive slurry.

30. The method in accordance with claim 23, wherein said step of separating said semiconductor devices comprises etching through the wafer substrate in the street areas.

31. The method in accordance with claim 23, wherein said step of separating said semiconductor devices comprises mechanical scribing.

32. The method in accordance with claim 23, wherein said step of applying said sealant material to said second side of said wafer substrate comprises attaching a second plate of glass to said second side of said wafer substrate with a sealant adhesive.

33. The method in accordance with claim 23, wherein the step of applying said sealant material to said second side of said wafer substrate comprises application of a polymeric sealant thereto.

34. The method in accordance with claim 23, wherein the step of forming said contact holes comprises forming substantially linear holes through said first glass plate in an array substantially identical to the at least one bond pad.

35. The method in accordance with claim 34, wherein said substantially linear holes are formed by one of a photo-etching process and a mechanical drilling process.

36. The method in accordance with claim 23, wherein said metallizing step comprises applying a metal to said exterior surface of said first glass plate including said contact holes, and etching to provide at least one separate interconnect and at least one separate lead passing through said contact holes to connect said at least one separate interconnect with said at least one bond pad.

37. The method in accordance with claim 23, wherein said metallization is applied by chemical vapor deposition (CVD).

38. The method in accordance with claim 23 wherein said metallization is applied by sputtering.

39. The method in accordance with claim 23, wherein said metallizing step comprises application of one of tungsten, aluminum and copper, and alloys thereof.

40. The method in accordance with claim 23, wherein said metallizing step comprises application of one of palladium and an alloy thereof.

41. The method in accordance with claim 23, further comprising the step of applying an insulative sealant coating over said exterior surface of said first glass layer prior to the metallizing step.

42. The method in accordance with claim 41, wherein said insulative sealant comprises silicon nitride.

43. A method of making semiconductor devices, said method comprising:
providing a semiconductor wafer substrate having a first side and a second side, a plurality of semiconductor devices formed on said wafer substrate with street areas therebetween, each of said plurality of semiconductor devices having a circuit formed therein and an array of bond pads on a first side thereof and conductively connected to said circuit;
forming a first sealing layer of glass on said first side of said wafer substrate as a hardenable fluid;
hardening said first layer of glass;
polishing and planarizing said hardened first glass layer to be parallel to said second side of said wafer substrate;
reducing a thickness of said wafer substrate by removing a portion of the second side thereof;
separating said semiconductor devices by removing substrate material in said street areas, said semiconductor devices remaining fixed to said first glass layer;
applying a sealant material to said second side of said wafer substrate;
forming an array of contact holes extending through said first glass layer to the array of bond pads;
metallizing an exterior surface of said first glass layer to form a pattern of conductive leads for connecting said bond pads to said metallized exterior surface of said first glass layer; and
singulating said semiconductor devices by separation thereof in said street areas.

44. The method in accordance with claim 43, wherein said first layer of glass is photo-etchable.

45. The method in accordance with claim 43, wherein said reducing step includes planarizing the second side of said water substrate to be parallel with the exterior surface of said first glass layer.

46. The method in accordance with claim 43, wherein the thickness of said wafer substrate is reduced by a chemical etching step.

47. The method in accordance with claim 43, wherein the thickness of said wafer substrate is reduced by a mechanical polishing step.

48. The method in accordance with claim 43, wherein the thickness of said wafer substrate is reduced by mechanical polishing with a chemical etchant/abrasive slurry.

49. The method in accordance with claim 43, wherein said step of separating said semiconductor devices comprises etching through the wafer substrate in the street areas.

50. The method in accordance with claim 43, wherein said step of separating said semiconductor devices comprises mechanical scribing.

51. The method in accordance with claim 43, wherein the step of applying said sealant material to said second side of said wafer substrate comprises application of a polymeric sealant thereto.

52. The method in accordance with claim 43, wherein the step of forming said contact holes comprises forming substantially linear holes through said first glass layer in an array substantially identical to the bond pad array.

53. The method in accordance with claim 52, wherein said substantially linear holes are formed by one of a photo-etching process and a mechanical drilling process.

54. The method in accordance with claim 43, wherein said metallizing step comprises applying a metal to said exterior surface of said first glass layer including said contact holes, and etching to provide separate interconnects and leads passing through said contact holes to connect said interconnects with said bond pads.

55. The method in accordance with claim 43, wherein said metallization is applied by chemical vapor deposition (CVD).

56. The method in accordance with claim 43, wherein said metallization is applied by sputtering.

57. The method in accordance with claim 43, wherein said metallizing step comprises application of one of tungsten, aluminum and copper, and alloys thereof.

58. The method in accordance with claim 43, wherein said metallizing step comprises application of one of palladium and an alloy thereof.

59. The method in accordance with claim 43, further comprising the step of applying an insulative sealant coating over said exterior surface of said first glass layer at one of prior to and following the metallizing step.

60. The method in accordance with claim 59, wherein said insulative sealant coating comprises silicon nitride.

* * * * *

UNITED STATES PATENT AND TRADEMARK OFFICE
CERTIFICATE OF CORRECTION

PATENT NO.   : 6,008,070
DATED          : December 28, 1999
INVENTOR(S) : Farnworth It is certified that error appears in the above-identified patent and that said Letters Patent is hereby corrected as shown below:

Title page,
Item [54], Title, before "WAFER" insert -- IMPROVED --;

Item [56], References Cited, U.S. PATENT DOCUMENTS,"
Second column, 2nd entry, change "Van Der Hare" to -- Van Der Have --; and
Second column, 5th entry, "Babehi" to -- Badehi --.

Column 1,
Line 1, before "WAFER" insert -- IMPROVED --;
Line 56, change "heretically" to -- hermetically --;

Column 2,
Line 38, change "tipper" to -- upper --;

Column 5,
Line 1, after "material" delete ";" and insert -- , -- therefor; and
Line 55, after "of" insert -- the --.

Column 7, claim 2,
Line 17, delete "array of said" and insert -- at least one -- and change "pads" to -- pad --;
Line 20, before "bond" insert -- at least one -- and change "pads" to -- pad --;

Column 9, claim 34,
Line 23, after "said" insert -- array of --;

Column 9, claim 36,
Line 31, after "including said" insert -- array of --;
Line 33, after "said" insert -- array of --;

Column 10, claim 45,
Line 15, change "water" to -- wafer --;

Column 10, claim 52,
Line 37, after "said" insert -- array of --;

UNITED STATES PATENT AND TRADEMARK OFFICE
CERTIFICATE OF CORRECTION

PATENT NO. : 6,008,070
DATED : December 28, 1999
INVENTOR(S) : Farnworth

It is certified that error appears in the above-identified patent and that said Letters Patent is hereby corrected as shown below:

<u>Column 10, claim 54,</u>
Line 45, after "including said" insert -- array of --; and
Line 47, after "said" insert -- array of --.

Signed and Sealed this

Twenty-fifth Day of December, 2001

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,008,070  
DATED : December 28, 1999  
INVENTOR(S) : Warren M. Farnworth Page 1 of 1

It is certified that error appears in the above-identified patent and that said Letters Patent is hereby corrected as shown below:

<u>Column 7,</u>  
Line 14, please delete Claim 2 (canceled in Amendment).

Signed and Sealed this

Seventh Day of May, 2002

Attest:

Attesting Officer

JAMES E. ROGAN  
Director of the United States Patent and Trademark Office